United States Patent
Watanabe et al.

(10) Patent No.: US 11,069,651 B2
(45) Date of Patent: Jul. 20, 2021

(54) METHOD OF MOUNTING DIE

(71) Applicants: SHINKAWA LTD., Tokyo (JP); VALQUA, LTD., Tokyo (JP)

(72) Inventors: Osamu Watanabe, Tokyo (JP); Tomonori Nakamura, Tokyo (JP); Yoshihito Hagiwara, Tokyo (JP); Yuji Kanai, Tokyo (JP)

(73) Assignees: SHINKAWA LTD., Tokyo (JP); VALQUA, LTD., Tokyo (JP)

( * ) Notice: Subject to any disclaimer, the term of this patent is extended or adjusted under 35 U.S.C. 154(b) by 321 days.

(21) Appl. No.: 16/305,393

(22) PCT Filed: May 30, 2017

(86) PCT No.: PCT/JP2017/020054
§ 371 (c)(1),
(2) Date: Nov. 29, 2018

(87) PCT Pub. No.: WO2017/209115
PCT Pub. Date: Dec. 7, 2017

(65) Prior Publication Data
US 2020/0321311 A1  Oct. 8, 2020

(30) Foreign Application Priority Data
May 31, 2016  (JP) ............................. JP2016-108918

(51) Int. Cl.
*H01L 21/00* (2006.01)
*H01L 23/00* (2006.01)
*H01L 21/683* (2006.01)

(52) U.S. Cl.
CPC .......... *H01L 24/83* (2013.01); *H01L 21/6838* (2013.01); *H01L 24/13* (2013.01);
(Continued)

(58) Field of Classification Search
CPC ..... H01L 24/83; H01L 21/6838; H01L 24/13; H01L 24/75; H01L 2224/75654; H01L 2224/83862; H01L 2924/3641
See application file for complete search history.

(56) References Cited

U.S. PATENT DOCUMENTS

| | | |
|---|---|---|
| 6,269,999 B1 | 8/2001 | Okazaki et al. |
| 2010/0261312 A1* | 10/2010 | Maki ............... H01L 24/95 438/109 |
| 2018/0019223 A1 | 1/2018 | Terada |

FOREIGN PATENT DOCUMENTS

| | | |
|---|---|---|
| JP | 05-190665 | 7/1993 |
| JP | 2001-053113 | 2/2001 |

(Continued)

OTHER PUBLICATIONS

"International Search Report (Form PCT/ISA/210) of PCT/JP2017/020054," dated Jul. 11, 2017, with English translation thereof, pp. 1-4.

*Primary Examiner* — Richard A Booth
(74) *Attorney, Agent, or Firm* — JCIPRNET

(57) ABSTRACT

A method of mounting a die includes: preparing a die having a bump formation surface on which a plurality of bump electrodes are formed; disposing a vacuum suction tool having a suction surface above the die such that the suction surface faces toward the bump formation surface; sandwiching a porous sheet between the suction surface and the bump formation surface and suctioning the die by the vacuum suction tool; and mounting the die that has been suctioned by the vacuum suction tool in a bonding region of a substrate with an adhesive material interposed therebetween, the porous sheet having a thickness equal to or greater than the protrusion height of the bump electrodes on the bump formation surface. Stabilization and ease of maintenance of vacuum suction can thereby be improved.

8 Claims, 5 Drawing Sheets

(52) U.S. Cl.
CPC .... *H01L 24/75* (2013.01); *H01L 2224/75654* (2013.01); *H01L 2224/83862* (2013.01); *H01L 2924/3641* (2013.01)

(56) References Cited

FOREIGN PATENT DOCUMENTS

| | | |
|---|---|---|
| JP | 2002134564 | 5/2002 |
| JP | 2003-218590 | 7/2003 |
| JP | 2004-128339 | 4/2004 |
| JP | 2006-066625 | 3/2006 |
| JP | 2006-066767 | 3/2006 |
| JP | 5669137 | 2/2015 |
| JP | 2015170690 | 9/2015 |
| WO | 2016125764 | 8/2016 |

\* cited by examiner

METHOD OF MOUNTING DIE

CROSS-REFERENCE TO RELATED APPLICATION

This application is a 371 application of International PCT application serial no. PCT/JP2017/020054, filed on May 30, 2017, which claims the priority benefit of Japan application no. 2016-108918, filed on May 31, 2016. The entirety of each of the abovementioned patent applications is hereby incorporated by reference herein and made a part of this specification.

TECHNICAL FIELD

The present invention relates to a method of mounting a die.

BACKGROUND ART

A technique for picking up, through vacuum suction, a plurality of dies that have been cut into individual pieces by dicing is known (see Patent Literatures 1 and 2). For example, Patent Literature 2 discloses that a bare chip with bumps provided on a terminal is vacuum-suctioned on a side of a surface opposite to a bare chip circuit functional surface including the terminal and the bumps. A bare chip that is vacuum suctioned to the tool is mounted on a substrate, which is coated with an adhesive, in such an orientation in which the circuit function surface is caused to face the substrate. The invention of Patent Literature 2 employs a configuration in which a sheet is interposed between the suction surface of the tool and the bare chip in order to prevent the adhesive on the substrate from creeping up from a side surface of the bare chip due to the vacuum suction, pressurization of the tool, or the like, and this inhibits the creeping-up of the adhesive and prevents the adhesive from adhering to the tool.

CITATION LIST

Patent Literature

[Patent Literature 1]
Japanese Unexamined Patent Application Publication No. 2006-66625
[Patent Literature 2]
Japanese Patent No. 5669137

SUMMARY OF INVENTION

Technical Problem

Here, the invention of Patent Literature 2 assumes that a bare chip is vacuum-suctioned on the circuit function surface, and vacuum suction on the side of a bump formation surface with bump electrodes formed thereon is not taken into consideration. In this regard, since the bump formation surface is provided with irregularities due to the bump electrodes, a gap may be generated between the tool suction surface and the die due to the protrusion height of the bump electrodes in a case in which the die is vacuum-suctioned to the tool. Therefore, there is a case in which air leakage occurs and tool suctioning properties deteriorate due to a decrease in a vacuum level in a case in which the die is vacuum-suctioned.

In addition, in a case in which the die is mounted on the substrate using the adhesive material, fume gas may be generated from the adhesive material, the fume gas may flow in from the gap generated due to the protrusion height of the bump electrodes, and the tool and the like may be contaminated. Therefore, necessity to frequently clean the tool and the like may occur, and stabilization and ease of maintenance of vacuum suction may deteriorate.

The present invention has been realized in view of such circumstances, and an object thereof is to improve stabilization and ease of maintenance of vacuum suction.

Solution to Problem

A method of mounting a die according to an aspect of the present invention includes: preparing a die having a bump formation surface on which a plurality of bump electrodes are formed; disposing a vacuum suction tool having a suction surface above the die in an orientation such that the suction surface faces the bump formation surface; sandwiching a porous sheet between the suction surface and the bump formation surface, so that the die is suctioned by the vacuum suction tool; and mounting the die that has been suctioned by the vacuum suction tool in a bonding region of a substrate with an adhesive material interposed therebetween.

With the aforementioned configuration, it is possible to provide the porous sheet in a gap between the suction surface of the vacuum suction tool and the bump formation surface of the die when the die is mounted in a bonding region on the substrate. Since it is possible to prevent air from leaking from the gap in this manner, it is possible to maintain suctioning force of the die. In addition, it is possible to inhibit suctioning of unnecessary substances such as gas or the like generated from the adhesive material by providing the porous sheet in the gap. Therefore, it is possible to inhibit contamination of the vacuum suction tool and to improve ease of maintenance.

According to the method of mounting a die, the porous sheet may have a thickness equal to or greater than the protrusion height of the bump electrodes on the bump formation surface.

According to the method of mounting a die, the porous sheet may be formed of a material softer than the bump electrodes or the suction surface.

According to the method of mounting a die, the porous sheet may be made of non-woven cloth.

In the method of mounting a die, the suction surface may have a larger size than the bump formation surface.

According to the method of mounting a die, in the mounting of the die, the die may be mounted on the bonding region of the substrate by heating the die and the adhesive material with a vacuum suction tool, and the porous sheet serve as a filter that inhibits entry of fume gas generated when the die or the adhesive material is heated, into a suction hole of the vacuum suction tool.

According to the method of mounting a die, the porous sheet may be fed from a pair of reels disposed on left and right sides of the vacuum suction tool.

Advantageous Effects of Invention

According to the present invention, it is possible to improve stabilization and ease of maintenance of vacuum suction.

DESCRIPTION OF EMBODIMENT

Figure 1:
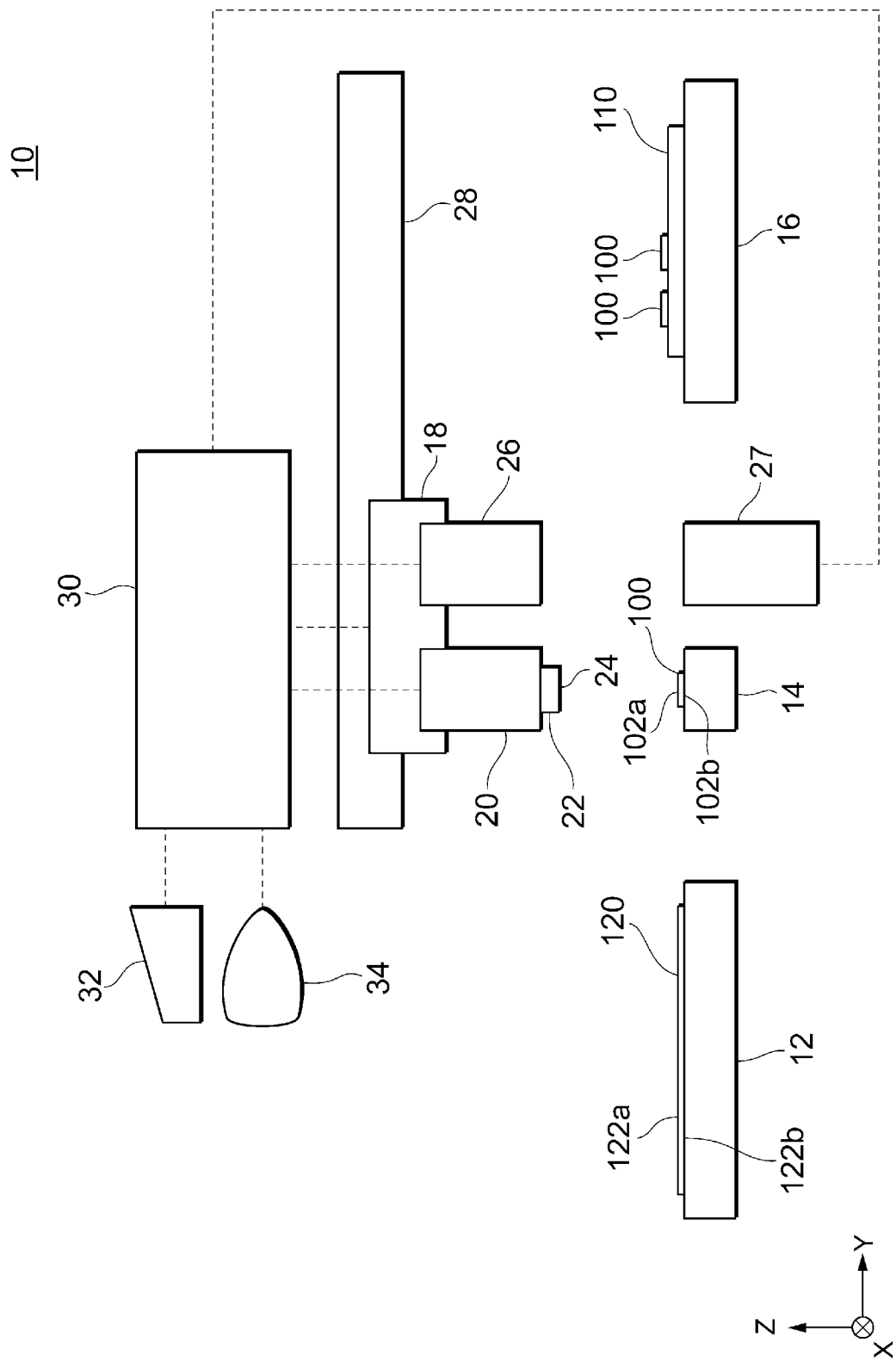
FIG. 1 is a diagram illustrating a bonding apparatus that is used in a method of mounting a die according to an embodiment of the present invention.

Hereinafter, an embodiment of the present invention will be described. In the following description of the drawings, the same or similar components will be represented by the same or similar reference numerals. The drawings are for illustrative purposes, the dimensions and the shapes of the respective parts are schematically illustrated, and interpretation of the technical scope of the present invention is not limited to the embodiment.

FIG. 1 is a diagram illustrating an outline of a bonding apparatus 10 that is used in a method of mounting a die according to an embodiment of the present invention. The bonding apparatus 10 is a die bonding apparatus for mounting a die 100 in a bonding region on a substrate 110.

The die 100 is made of a semiconductor material. The die 100 is formed into a rectangular parallelepiped shape that has a front surface and a rear surface that are main surfaces. Specifically, the die 100 has a first surface 102a that is a surface on which a predetermined circuit pattern is formed and a second surface 102b that is a rear surface on a side opposite to the first surface 102a. In the embodiment, the die 100 is mounted on the substrate 110 in such an orientation in which the second surface 102b of the die 100 faces the substrate 110. The mounting form in this orientation is typically called die bonding. Note that details of the first surface 102a of the die 100 will be described later.

The bonding apparatus 10 includes a wafer stage 12, an intermediate stage 14, a bonding stage 16, a bonding head 18, a vacuum suction tool 22 that is attached to the bonding head 18 via a Z-axis drive mechanism 20, imaging units 26 and 27 that acquire image information of the die 100, an XY table 28 that causes the bonding head 18 to move in X-axis and Y-axis directions, and a control unit 30 that controls operations of these respective configurations.

The following description will be given on the assumption that the X-axis and Y-axis directions are directions that are parallel to a main surface of the die 100 (or a main surface of any of the stages) and a Z-axis direction is a direction that is perpendicular to the surface in the X-axis and Y-axis directions. Note that the X-axis direction and the Y-axis direction intersect one another orthogonally.

A wafer 120 formed of a plurality of dies 100, which have been cut into individual pieces, is placed on the wafer stage 12. The wafer 120 has a first surface 122a (corresponding to the first surface 102a of the die 100) that is a front surface on which a predetermined circuit pattern is formed and a second surface 122b (corresponding to the second surface 102b of the die 100) that is a rear surface on a side opposite to the first surface 122a. The wafer 120 may be secured on the wafer stage 12 by the second surface 122b being attached to a film on the wafer stage 12. The dies 100 on the wafer stage 12 are transferred to the intermediate stage 14 by a transfer head (not illustrated) after the dies 100 are picked up through a cooperative operation of the vacuum suction tool 22 and a picking-up unit (not illustrated).

The intermediate stage 14 is a stage for temporarily placing the dies 100 thereon. The intermediate stage is disposed between the wafer stage 12 and the bonding stage 16. The dies 100 are disposed on the intermediate stage 14 in such an orientation in which the second surface 102b faces the intermediate stage 14. The intermediate stage 14 is configured to be able to be moved in the X-axis and Y-axis directions by a drive mechanism such as a linear motor (not illustrated). The dies 100 may be secured on the intermediate stage 14 by the second surface 102b being attached to a film on the intermediate stage 14. The dies 100 on the intermediate stage 14 are transferred to the bonding stage 16 by a transfer head (not illustrated) after the dies 100 are picked up by a cooperative operation of the vacuum suction tool 22 and the picking-up unit (not illustrated).

The substrate 110 is disposed on the bonding stage 16. The substrate 110 may be secured on the bonding stage 16 by being attached to a film on the bonding stage 16, for example. The substrate 110 has at least one bonding region, and any of the dies 100 are mounted in the bonding region. In a case in which the substrate 110 has a plurality of bonding regions, for example, it is possible to obtain a plurality of completed products (semiconductor devices) by cutting the substrate 110 into individual pieces corresponding to the respective bonding regions after the dies 100 are mounted in the respective bonding regions.

In addition, a plurality of dies 100 may be mounted in the respective bonding regions on the substrate 110 by being piled up thereon. In such a stacking-type semiconductor device, all of two or more dies 100 laminated in the same bonding region may be mounted such that all the first surfaces 102a thereof face a direction opposite to the substrate 110. Alternatively, some of the dies laminated in the same bonding region may be mounted in an orientation different from that of the other dies.

A material of the substrate 110 may be formed of an organic material (for example, an epoxy substrate or a polyimide substrate, for example), an inorganic material (for example, a glass substrate), or a composite material thereof (for example, a glass epoxy substrate), for example. The substrate 110 may be a so-called interposer. In addition, the substrate 110 may be formed of a metal material (for example, a lead frame material).

Note that the bonding stage 16 is configured such that the substrate 110 can be moved in the X-axis direction by a drive mechanism such as a guide rail (not illustrated). In addition, the bonding stage 16 includes heating means for heating the substrate 110.

The vacuum suction tool 22 is attached to the bonding head 18 via the Z-axis drive mechanism 20, and an imaging unit 26 is attached thereto at a position that is separated from the vacuum suction tool 22 by a predetermined distance. In other words, the vacuum suction tool 22 and the imaging unit 26 are secured to the bonding head 18, and the vacuum suction tool 22 and the imaging unit 26 are moved together in the X-axis and Y-axis directions by the bonding head 18 being moved by the XY table 28, in the example illustrated in FIG. 1. In addition, an imaging unit 27 may be provided on the side opposite to the imaging unit 26. The imaging unit 26 may be able to image the first surface 102a of the die 100 while the imaging unit 27 may be able to image the second surface 102b of the die 100. Note that the imaging unit 26 may not be secured to the bonding head 18 and may be able to move separately from the vacuum suction tool 22.

The vacuum suction tool 22 has a suction surface 24 that vacuum-suctions the die 100. The vacuum suction tool 22 is for suctioning and holding the die 100 to transfer the die 100 to a predetermined position and for pressurizing the die 100 to mount the die 100 on the substrate 110. Note that details of the vacuum suction tool 22 will be described later.

The control unit 30 is for controlling processing that is necessary for performing bonding by the bonding apparatus 10. The control unit 30 performs X-axis, Y-axis, and Z-axis driving of the vacuum suction tool 22, position control of the vacuum suction tool 22 including θ-axis drive (rotation about the Z axis) and tilting drive (inclination direction), control for turning on or off of vacuum extraction, control of a load when the die 100 is mounted on the substrate 110, control of heating of the substrate 110, and the like. The control unit 30 is connected such that signals can be transmitted and received to and from the respective configurations, such as the bonding head 18, the vacuum suction tool 22, and the imaging unit 26, and controls operations thereof in this manner.

An operation unit 32 that is for inputting control information and a display unit 34 that is for outputting the control information are connected to the control unit 30. In this manner, it is possible for an operator to input necessary control information through the operation unit 32 while perceiving a screen using the display unit 34.

The control unit 30 is a computer device provided with a CPU, a memory, and the like, and a bonding program and the like for performing processing necessary for bonding are stored in advance in the memory. The control unit 30 is configured to be able to execute the respective processes related to a method of mounting a die according to the embodiment, which will be described later (for example, a program for causing a computer to execute the respective operations may be provided).

Next, the method of mounting a die according to the embodiment will be described with reference to FIGS. 2 to 5. The method of mounting a die according to the embodiment can be performed by using the bonding apparatus 10 illustrated in FIG. 1.

Figure 2:
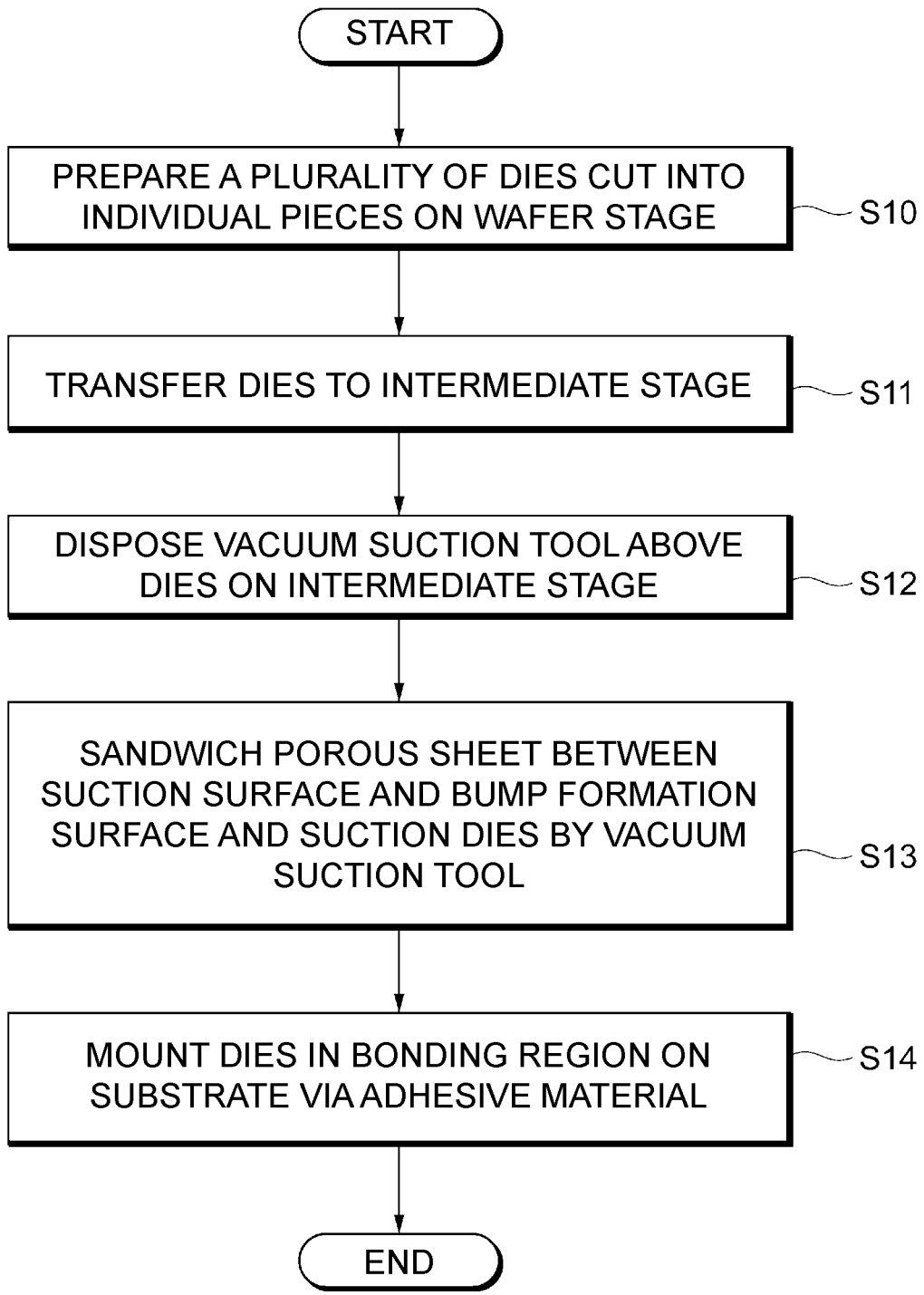
FIG. 2 is a diagram illustrating a flowchart of the method of mounting a die according to the embodiment of the present invention
Figure 3:
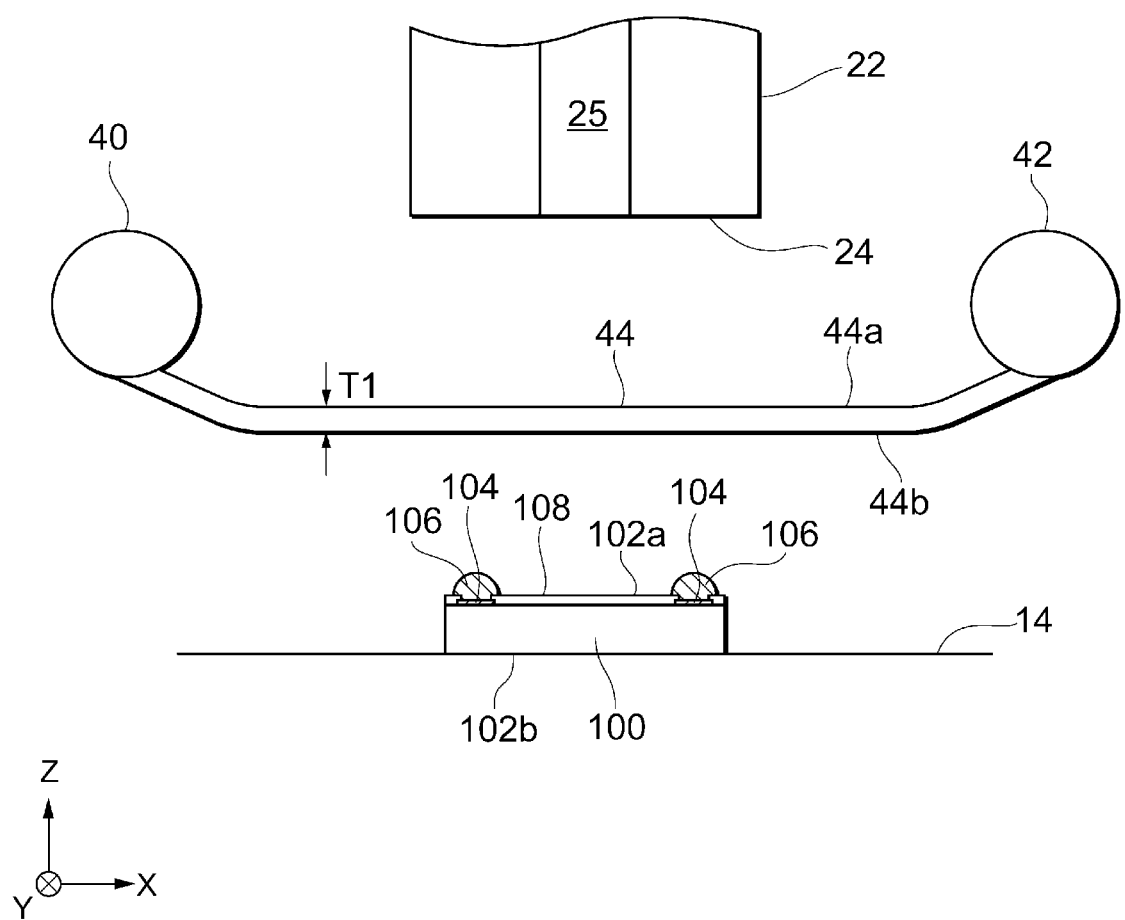
FIG. 3 is a diagram for describing the method of mounting a die according to the embodiment of the present invention, and specifically, it is a diagram illustrating a process in which a tool is disposed above the die.
Figure 4:
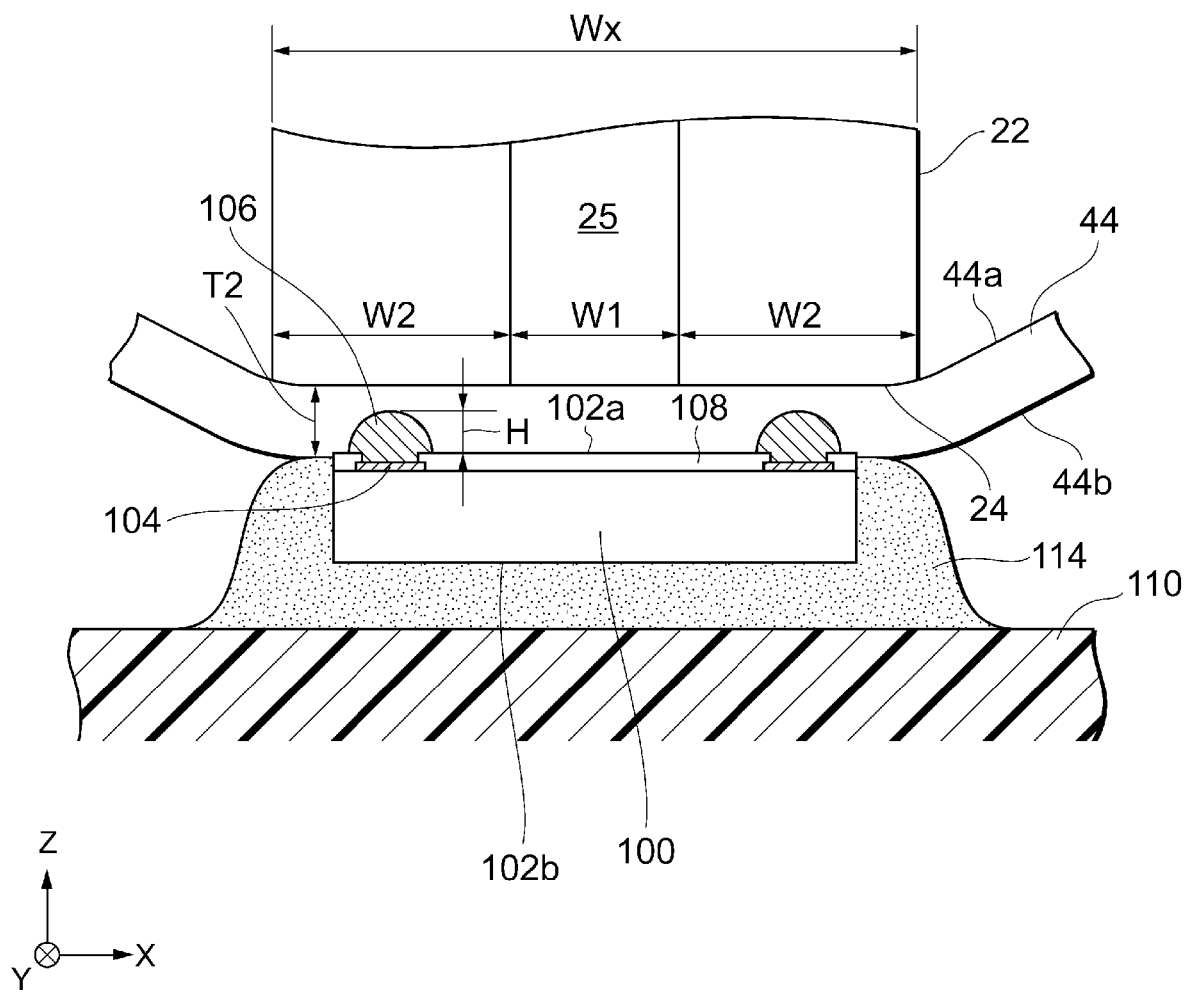
FIG. 4 is a diagram for describing the method of mounting a die according to the embodiment of the present invention, and specifically, it is a diagram illustrating a process in which the die suctioned to the tool is mounted on a substrate using an adhesive material.
Figure 5:
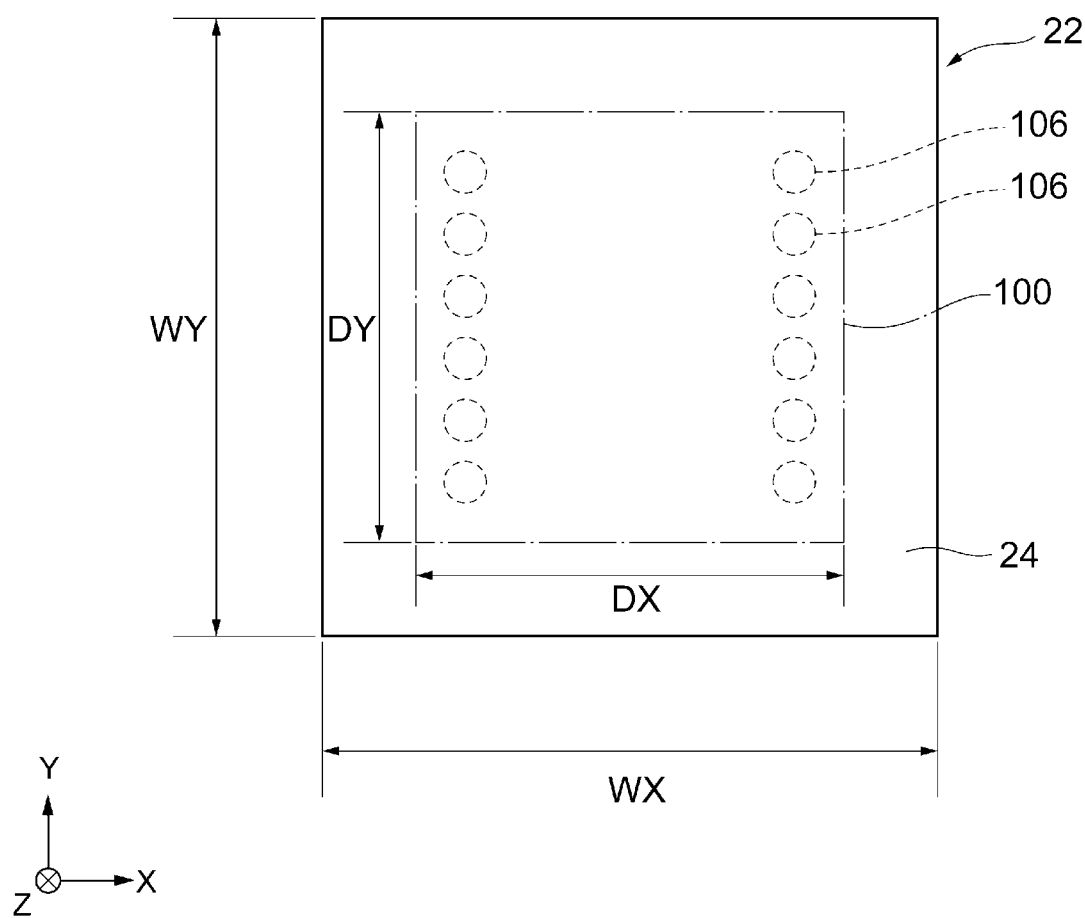
FIG. 5 is a diagram for describing the method of mounting a die according to the embodiment of the present invention, and specifically, it is a plan view illustrating a size relationship between a suction surface of the tool and a bump formation surface of the die.

Here, FIG. 2 is a flowchart for describing the method of mounting a die according to the embodiment. FIG. 3 is a diagram illustrating a process in which a tool is disposed above a die, and FIG. 4 is a diagram illustrating a process in which a die suctioned to the tool is mounted on a substrate using an adhesive material. Also, FIG. 5 is a plan view illustrating a size relationship between a suction surface of the tool and a bump formation surface of a die.

First, a plurality of dies 100, which have been cut into individual pieces, are prepared on the wafer stage 12 (S10). Specifically, the wafer 120 formed of the plurality of dies 100 attached to a film is prepared on the wafer stage 12, as illustrated in FIG. 1. The wafer 120 is disposed on the wafer stage 12 in such an orientation in which the first surfaces 102a of the plurality of respective dies 100 face the side above and the second surfaces 102b thereof face the wafer stage 12.

Next, the dies 100 are transferred to the intermediate stage 14 (S11). Specifically, the plurality of dies 100 on the wafer stage 12 are transferred one by one to the intermediate stage 14. As described above, transfer of the dies 100 may be performed using the vacuum suction tool 22.

Next, the vacuum suction tool 22 is disposed above the dies 100 on the intermediate stage 14 (S12). Here, further details of the vacuum suction tool 22 and the dies 100 will be described.

The vacuum suction tool 22 has a suction surface 24 that faces the first surfaces 102a of the dies 100. In addition, at least one suction hole 25 for vacuum extraction is provided in the suction surface 24. The suction hole 25 may be provided at the center of the suction surface 24 in the view of the XY plane.

The dies 100 are secured on the intermediate stage 14 by the second surfaces 102b being attached to a film (not illustrated) on the intermediate stage 14 as illustrated in FIG. 3. A plurality of electrode pads 104, a plurality of bump electrodes 106 provided on the plurality of electrode pads 104, and a protective film 108 provided in the surroundings of the plurality of bump electrodes 106 are provided on the first surfaces 102a of the dies 100. The electrode pads 104 are terminals that are electrically connected to circuit patterns formed on the first surfaces 102a. In addition, outer circumferential ends of the electrode pads 104 are covered by the protective film 108, and the centers of the electrode pads 104 exposed in this manner serve as part connecting to the bump electrodes 106.

As illustrated in FIG. 4, the bump electrodes 106 have a height H that projects from the upper surface of the protective film 108 on the first surfaces 102a. The height H of the bump electrodes 106 is a distance between apexes of the bump electrodes 106 and the upper surface of the protective film 108.

Materials of the electrode pads 104 and the bump electrodes 106 are not limited, and the material of the electrode pads 104 may be aluminum, copper, or the like, and the material of the bump electrodes 106 may be gold or the like, for example.

In the example illustrated in FIG. 3, a porous sheet 44 is disposed between such first surfaces 102a of the dies 100 and the suction surface 24 of the vacuum suction tool 22. It is possible to dispose the porous sheet 44 between the dies 100 and the vacuum suction tool 22 by disposing a pair of reels 40 and 42, to which the porous sheet 44 is attached, above the intermediate stage 14, for example. The pair of reels 40 and 42 are a feeding reel 40 and a winding reel 42. It is possible to sequentially feed a partial region of the porous sheet 44 between the first surfaces 102a of the dies 100 and the suction surface 24 of the vacuum suction tool 22 by transporting a part of the porous sheet 44 fed from the supply reel 40 to the winding reel 42.

In the example illustrated in FIG. 3, the porous sheet 44 has a length direction in the X-axis direction in which the reels 40 and 42 are aligned, a width direction in the Y-axis direction, and a thickness direction in the Z-axis direction. The porous sheet 44 has a first surface 44a that faces the suction surface 24 of the vacuum suction tool 22 and a second surface 44b that faces the first surfaces 102a of the dies 100, and the distance between the first surface 44a and the second surface 44b corresponds to the thickness of the porous sheet 44. As illustrated in FIG. 3, the porous sheet 44 has a thickness T1. In the embodiment, the thickness T1 and the height H of the bump electrodes 106 have a relationship of $T1 \geq H$. In this case, the thickness T1 of the porous sheet 44 is preferably 5 to 10 times as long as the height H of the bump electrodes 106, and it is possible to use the porous sheet 44 with a thickness within a range in which heat transmission from a heater is not interrupted.

The length of the porous sheet 44 in the width direction is greater than the width of the first surfaces 102a of the dies 100 in the Y-axis direction and is also greater than the width of the vacuum suction tool 22 in the Y-axis direction. In this manner, it is possible to cause the porous sheet 44 to be interposed between the first surfaces 102a of the dies 100 and the suction surface 24 of the vacuum suction tool 22.

The porous sheet 44 has a plurality of holes for allowing ventilation between the first surface 44a and the second surface 44b. The Gurley value of the porous sheet 44 is preferably as small a value as possible in order than a chip may be suctioned and is preferably within a range of 1 to 2 (s/100 cc/in$^2$), for example.

The porous sheet 44 is made of a material softer than both the bump electrode 106 and the suction surface 24 in order to at least partially absorb the protrusion height of the bump electrodes 106 using the first surfaces 102a when the dies 100 are mounted on the substrate 110. The porous sheet 44 may be non-woven cloth for example.

The porous sheet 44 may be polyetrafluoroethylene (PTFE), for example. In this case, the porous sheet 44 may be PTFE nanofibers. PTFE nanofibers with a pore diameter of about 1 to 2 μm, a thickness of about 56 μm, and a Gurley value of 1.2 (s/100 cc/in$^2$) may be used. The PTFE nanofibers can reduce the Gurley value (improve ventilation characteristics) regardless of a thick thickness, and since the PTFE nanofibers hardly thermally contract even when heated at about 260° C., the PTFE nanofibers have heat resistance in a manufacturing process in which heating to 230° C. or higher is applied. Therefore, the PTFE nanofibers are effective when used for the porous sheet 44 in the embodiment.

Returning to the flowchart in FIG. 2, the porous sheet 44 is sandwiched between the suction surface 24 of the vacuum suction tool 22 and the first surfaces 102a (bump formation surfaces) of the die 100 next, and the dies 100 are suctioned by the vacuum suction tool 22 (S13). Specifically, in FIG. 3, vacuum extraction is performed from the suction holes 25 of the vacuum suction tool 22 in a state in which the vacuum suction tool 22 is lowered and the porous sheet 44 is sandwiched between the suction surface 24 thereof and the first surfaces 102a of the dies 100. In this manner, it is possible to suction the dies 100 over the porous sheet 44 to the suction surface 24 of the vacuum suction tool 22. Thereafter, both the vacuum suction tool 22 is transferred along with the porous sheet 44 to the bonding stage 16. In this manner, the dies 100 are transferred to a location above the bonding region on the substrate 110.

Next, the dies 100 are mounted in the bonding region on the substrate 110 using the adhesive material 114 (S14). Specifically, the adhesive material 114 is provided in advance in the bonding region on the substrate 110, and the first surfaces 102a of the dies 100 are pressurized over the porous sheet 44 using the vacuum suction tool 22 as illustrated in FIG. 4 by causing the vacuum suction tool 22 to be lowered. At this time, the dies 100 and the adhesive material 114 are heated. In this manner, the adhesive material 114 is heated, melted, and then cured. In this manner, the dies 100 are mounted in the bonding region on the substrate 110 using the adhesive material 114 in the state in which the porous sheet 44 is sandwiched between the suction surface 24 and the first surfaces 102a as illustrated in FIG. 4.

As the adhesive material 114, a material formed into a sheet shape at an ordinary temperature may be used, or alternatively, a material formed into a paste form at an ordinary temperature may be used. The adhesive material 114 may be a thermosetting resin, for example. In this case, it is possible to melt and cure the adhesive material 114 by heating the adhesive material 114.

A thickness T2 (T2≤T1) of the porous sheet 44 during the pressurization preferably has a relationship of T2≥H with respect to the protrusion height H of the bump electrodes 106.

In this manner, it is possible to provide the porous sheet 44 in the gap between the suction surface 24 of the vacuum suction tool 22 and the first surfaces 102a of the dies 100 when the dies 100 are mounted in the bonding region on the substrate 110. In this manner, it is possible to prevent air from leaking from the gap and thereby to maintain suctioning force for the dies 100 caused by suctioning from the suction holes 25. Further, it is possible to interrupt the air passing through the gap and to thereby uniformly perform heating.

In addition, fume gas generated when the dies 100 or the adhesive material 114 is heated is able to adhere to the suction surface 24 of the vacuum suction tool 22 and entry of the gas into the suction holes 25 is able to be inhibited by providing the porous sheet 44 in the gap. Therefore, it is possible to inhibit contamination of the suction surface 24, the suction holes 25, and the like of the vacuum suction tool 22 and to improve ease of maintenance.

Here, the suction surface 24 of the vacuum suction tool 22 may have a larger size than the first surfaces 102a of the dies 100 as illustrated in FIG. 5. Specifically, the width WX in the Y-axis direction and the width WY in the Y-axis direction of the vacuum suction tool 22 and the width DX in the X-axis direction and the width DY in the Y-axis direction of the dies 100 may satisfy WX≥DX ad WY≥DY.

In this manner, it is possible to reliably pressurize the dies 100 using the suction surface 24 and to uniformize pressurization force applied to the first surfaces 102a of the dies 100. Further, since the porous sheet 44 is interposed between the suction surface 24 and the first surfaces 102a in the embodiment, it is possible to interrupt the adhesive material 114 creeping up along the side surfaces of the dies 100 using the porous sheet 44 when the dies 100 are mounted on the substrate 110 using the adhesive material 114. Therefore, it is possible to prevent the adhesive material 114 from adhering to the suction surface 24 of the vacuum suction tool 22.

In addition, W1<W2 may be satisfied in a case in which the width W1 is taken as the width of the suction holes 25 of the vacuum suction tool 22 and the width W2 as the width at both ends in the width WX of the vacuum suction tool 22 in the X-axis direction as illustrated in FIG. 4. Also, the width W2 of the vacuum suction tool 22 and the thickness T2 of the porous sheet 44 during the pressurization may satisfy T2>W2 (or T1>W2). Note that FIG. 4 is a schematic diagram, and in particular, the relationship between the thickness T2 and each of the thicknesses W1 and W2 is not limited to that of the illustration.

In this manner, it is possible to prevent suctioning force of the vacuum suction tool 22 from deteriorating even if the porous sheet 44 is higher or the same height as the protrusion height H of the bump electrodes 106 since the distance from the end of the vacuum suction tool 22 to the suction holes 25 is shorter than the thickness of the porous sheet 44.

The present invention is not limited to the aforementioned embodiment and can be modified and applied in various manners. For example, the intermediate stage 14 in the aforementioned configuration may be omitted, and the dies 100 picked up in a state in which the porous sheet 44 is sandwiched may be transported from the wafer stage 12 to the bonding stage 16 by the vacuum suction tool 22.

Also, although the porous sheet 44 attached to the pair of reels 40 and 42 is used in the aforementioned embodiment, a plurality of sheets in individual piece form may be prepared as the porous sheets 44, and the sheets in the individual piece form may be interposed between the suction surface 24 of the vacuum suction tool 22 and the first surfaces 102a of the dies 100.

In addition, although the relationship of T1≥H between the height T1 of the porous sheet 44 and the height H of the bump electrodes 106 during an ordinary time has been described in the aforementioned embodiment, the present invention is not limited thereto, and the thickness T1 and the height H of the bump electrodes 106 may have a relationship of T1<H in a modification example. Also, although the relationship of T2≥H between the thickness T2 of the porous sheet 44 and the height H of the bump electrodes 106 during the pressurization has been described in the aforementioned embodiment, the present invention is not limited thereto, and the thickness T2 and the height H of the bump electrodes 106 may have a relationship of T2<H in a modification example.

Embodiments described through the aforementioned embodiment of the present invention may be used by arbitrarily applying combinations, modifications, or improvements in accordance with purposes, and the present invention is not limited to the above description of the embodiment. It is obvious from the claims that configurations to which such combinations, modifications, or improvements have been applied are also within the technical scope of the present invention.

The invention claimed is:

1. A method of mounting a die comprising:
preparing a die having a bump formation surface on which a plurality of bump electrodes is formed;
disposing a vacuum suction tool having a suction surface above the die such that the suction surface faces toward the bump formation surface;
feeding a region of a porous sheet allowing ventilation to between the suction surface and the bump formation surface;
suctioning the porous sheet on the suction surface so that a suction hole formed in the suction surface is covered by the porous sheet;
sandwiching the porous sheet between the suction surface and the bump formation surface, so that the die is suctioned by the vacuum suction tool; and
mounting the die that has been suctioned by the vacuum suction tool in a bonding region of a substrate with an adhesive material interposed therebetween, comprising: pressurizing the die in the bonding region of the substrate using the vacuum suction tool such that a protrusion height of the bump electrodes is entirely absorbed in the porous sheet and heating the die and the adhesive material by the vacuum suction tool, wherein the porous sheet serves as a filter that inhibits entry of fume gas generated when the die or the adhesive material is heated into the suction hole of the vacuum suction tool,
wherein in the mounting of the die, when the die is pressurized using the vacuum suction tool, the porous sheet has a thickness equal to or greater than the protrusion height of the bump electrodes on the bump formation surface.

2. The method of mounting a die according to claim 1, wherein the porous sheet is made of a material softer than the bump electrodes and the suction surface.

3. The method of mounting a die according to claim 1, wherein the porous sheet is made of non-woven cloth.

4. The method of mounting a die according to claim 1, wherein the suction surface has a larger size than the bump formation surface.

5. The method of mounting a die according to claim 1, wherein the porous sheet is fed from a pair of reels disposed on left and right sides of the vacuum suction tool.

6. The method of mounting a die according to claim 2, wherein the porous sheet is made of non-woven cloth.

7. The method of mounting a die according to claim 2, wherein the suction surface has a larger size than the bump formation surface.

8. The method of mounting a die according to claim 2, wherein the porous sheet is fed from a pair of reels disposed on left and right sides of the vacuum suction tool.

* * * * *